(12) United States Patent
Wang et al.

(10) Patent No.: US 11,521,993 B2
(45) Date of Patent: Dec. 6, 2022

(54) DISPLAY PANEL AND METHOD OF MANUFACTURING THE SAME

(71) Applicant: Wuhan China Star Optoelectronics Technology Co., Ltd., Wuhan (CN)

(72) Inventors: Chao Wang, Wuhan (CN); Guanghui Liu, Wuhan (CN); Yuan Yan, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 819 days.

(21) Appl. No.: 16/323,523

(22) PCT Filed: Sep. 25, 2018

(86) PCT No.: PCT/CN2018/107203
§ 371 (c)(1),
(2) Date: Feb. 5, 2019

(87) PCT Pub. No.: WO2020/042258
PCT Pub. Date: Mar. 5, 2020

(65) Prior Publication Data
US 2021/0335855 A1  Oct. 28, 2021

(30) Foreign Application Priority Data

Aug. 28, 2018  (CN) .......................... 201810987086.X (51) Int. Cl.
*H01L 27/12* (2006.01)
*G02F 1/1362* (2006.01)
*G02F 1/1343* (2006.01)

(52) U.S. Cl.
CPC ...... *H01L 27/1288* (2013.01); *H01L 27/1248* (2013.01); *G02F 1/13439* (2013.01); *G02F 1/136227* (2013.01); *G02F 1/136236* (2021.01)

(58) Field of Classification Search
CPC ............. H01L 27/1288; H01L 27/1248; H01L 27/1462; H01L 27/1237; H01L 27/1259;
(Continued)

(56) References Cited

U.S. PATENT DOCUMENTS

2012/0009710 A1* 1/2012 Kim ...................... H01L 21/336
438/46
2015/0037943 A1 2/2015 Park et al.

FOREIGN PATENT DOCUMENTS

CN 101150092 A 3/2008
CN 102646717 A 8/2012
(Continued)

*Primary Examiner* — Nikolay K Yushin
(74) *Attorney, Agent, or Firm* — PV IP PC; Wei Te Chung; Ude Lu (57) ABSTRACT

A display panel and method of manufacturing the same are provided. The method of manufacturing the display panel includes the steps of providing a substrate, forming a gate on the substrate, forming a gate insulating layer on the gate and the substrate, forming a polysilicon layer on the gate insulating layer, performing a first gray-scale mask process on the polysilicon layer to form a source region, a drain region and an active region located between the source region and the drain region by the polysilicon layer, forming an interlayer dielectric layer on the gate insulating layer and the polysilicon layer, forming a first electrode layer on the interlayer dielectric layer, performing a second gray-scale mask process on the first electrode layer and the interlayer dielectric layer.

12 Claims, 10 Drawing Sheets

(58) Field of Classification Search
CPC .............. H01L 27/124; G02F 1/136236; G02F 1/13439; G02F 1/136227; G02F 1/1362; G02F 1/136231; G02F 2202/104
See application file for complete search history.

(56) References Cited

FOREIGN PATENT DOCUMENTS

| | | | |
|---|---|---|---|
| CN | 106898613 | A | 6/2017 |
| CN | 107527819 | A | 12/2017 |
| CN | 208738249 | U | 4/2019 |

\* cited by examiner

DISPLAY PANEL AND METHOD OF MANUFACTURING THE SAME

CROSS REFERENCE TO RELATED APPLICATIONS

This application claims the priority of International Application No. PCT/CN 2018/107203, filed on Sep. 25, 2018, which claims priority to Chinese Application No. 201810987086.X, filed on Aug. 28, 2018. The entire disclosures of each of the applications are incorporated herein by reference.

BACKGROUND OF THE INVENTION

Field of Invention

The present invention relates to a display panel and a method of manufacturing the same, and more particularly to a display panel capable of reducing the number of photomasks and a method of manufacturing the same.

Description of Prior Art

With the development of display technology, flat display devices, such as liquid crystal displays (LCDs), are widely used in various consumer electronic products like mobile phones, televisions, and personal digital assistants, digital cameras, laptops and desktop computers due to their high image quality, power saving, thin body and wide application range, and have become mainstream in display devices.

For example, liquid crystal displays using low temperature polysilicon (LTPS) as an active region allow the transistor to achieve a higher switching current ratio due to a higher carrier mobility of the low temperature polysilicon. Therefore, under the condition of satisfying the required charging current, the size of each pixel transistor can be scaled down, thereby increasing the light transmission area of each pixel and the panel aperture ratio. The panel bright spot and high resolution are improved, and power consumption of the panel is reduced. Thus, low temperature polysilicon (LTPS) liquid crystal displays can achieve a better visual experience.

However, since the size of each pixel transistor is progressing toward miniaturization, the cost of the photomask devices is exponentially increased.

Accordingly, it is necessary to provide a display panel and a method of manufacturing the same to solve the problems of the prior art.

SUMMARY OF THE INVENTION

In view of the above, the present invention provides a display panel and a method of manufacturing the same, and the problem of excessive use of photomasks in the prior art which leads to increased manufacturing costs can be solved.

One object of the present invention is to provide a method of manufacturing a display panel which reduces the number of photomasks used in the manufacturing a display panel by using two gray-scale mask processes, thereby reducing manufacturing costs.

Another object of the present invention is to provide a display panel which reduces the number of photomasks used in the manufacturing a display panel by using a gate as a light shielding layer, omitting a planar layer, and using a bottom electrode (bottom ITO; BITO) layer as a pixel electrode, thereby reducing manufacturing costs.

In order to achieve above-mentioned object of the present invention, one embodiment of the present invention provides a method of manufacturing a display panel, and the method of manufacturing the display panel includes the steps of providing a substrate, forming a gate on the substrate, forming a gate insulating layer on the gate and the substrate, forming a polysilicon layer on the gate insulating layer, performing a first gray-scale mask process on the polysilicon layer to form a source region, a drain region and an active region located between the source region and the drain region by the polysilicon layer, the first gray-scale mask process is selected from the group consisting of a half tone photomask process and a gray tone photomask process, forming an interlayer dielectric layer on the gate insulating layer and the polysilicon layer, forming a first electrode layer on the interlayer dielectric layer, performing a second gray-scale mask process on the first electrode layer and the interlayer dielectric layer, the second gray-scale mask process is selected from the group consisting of the half tone photomask process and the gray tone photomask process, and the second gray-scale mask process includes patterning the first electrode layer to form a first electrode pattern layer, and forming a source via and a drain via in the interlayer dielectric layer, the source via exposes the source region and the drain via exposes the drain region, and forming an electronic material pattern layer on the first electrode pattern layer and in the source via and the drain via of the interlayer dielectric layer, the electronic material pattern layer includes a source contact layer and a drain contact layer, the source contact layer is electrically connected to the source region through the source via, and the drain contact layer is electrically connected to the drain region through the drain via.

In one embodiment of the present invention, the electronic material pattern layer further includes an electrode contact layer, and the method of manufacturing the display panel further includes forming a passivation pattern layer on the source contact layer and the drain contact layer, and the passivation pattern layer exposes the electrode contact layer.

In one embodiment of the present invention, the method of manufacturing a display panel further includes forming a second electrode pattern layer on the passivation pattern layer and the electrode contact layer.

Furthermore, another embodiment of the present invention provides a method of manufacturing a display panel, and the method of manufacturing the display panel includes the steps of providing a substrate, providing a substrate, forming a gate on the substrate, forming a gate insulating layer on the gate and the substrate, forming a polysilicon layer on the gate insulating layer, performing a first gray-scale mask process on the polysilicon layer to form a source region, a drain region and an active region located between the source region and the drain region by the polysilicon layer, forming an interlayer dielectric layer on the gate insulating layer and the polysilicon layer, forming a first electrode layer on the interlayer dielectric layer, performing a second gray-scale mask process on the first electrode layer and the interlayer dielectric layer, and the second gray-scale mask process includes patterning the first electrode layer to form a first electrode pattern layer, and forming a source via and a drain via in the interlayer dielectric layer, and the source via exposes the source region and the drain via exposes the drain region.

In one embodiment of the present invention, the method of manufacturing a display panel further includes forming an electronic material pattern layer on the first electrode pattern layer and in the source via and the drain via of the interlayer dielectric layer, and the electronic material pattern layer includes a source contact layer and a drain contact layer, the source contact layer is electrically connected to the source region through the source via, and the drain contact layer is electrically connected to the drain region through the drain via.

In one embodiment of the present invention, the electronic material pattern layer further includes an electrode contact layer, and the method of manufacturing the display panel further includes forming a passivation pattern layer on the source contact layer and the drain contact layer, and the passivation pattern layer exposes the electrode contact layer.

In one embodiment of the present invention, the method of manufacturing the display panel further includes forming a second electrode pattern layer on the passivation pattern layer and the electrode contact layer.

In one embodiment of the present invention, the first gray-scale mask process and the second gray-scale mask process are selected from the group consisting of a half tone photomask process and a gray tone photomask process.

Moreover, the other embodiment of the present invention provides a display panel including a substrate, a gate, a gate insulating layer, a polysilicon layer, an interlayer dielectric layer and a first electrode pattern layer. The gate is disposed on the substrate. The gate insulating layer is disposed on the gate and the substrate. The polysilicon layer is disposed on the gate insulating layer, and the polysilicon layer includes a source region, a drain region and an active region disposed between the source region and the drain region. The interlayer dielectric layer is disposed on the gate insulating layer and the polysilicon layer, and the interlayer dielectric layer includes a source via and a drain via, and source via exposes the source region and the drain via exposes the drain region. The first electrode pattern layer is disposed on the interlayer dielectric layer.

In one embodiment of the present invention, the display panel further includes an electronic material pattern layer disposed on the first electrode pattern layer and in source via and drain via of the interlayer dielectric layer, and the electronic material pattern layer includes a source contact layer and a drain contact layer. The source contact layer is electrically connected to the source region through source via. The drain contact layer is electrically connected to the source region through source via In one embodiment of the present invention, the electronic material pattern layer further includes an electrode contact layer, and the display panel includes a passivation pattern layer, and the passivation pattern layer is disposed on the source contact layer and the drain contact layer, and the passivation pattern layer exposes the electrode contact layer.

In one embodiment of the present invention, the display panel includes a second electrode pattern layer disposed on the passivation pattern layer and the electrode contact layer.

In one embodiment of the present invention, the polysilicon layer is formed by a first gray-scale mask process, and the first electrode pattern layer and the interlayer dielectric layer are formed by a second gray-scale mask process.

In comparison with the prior art, the method of manufacturing the display panel accordingly to the embodiment of the present invention reduces the number of photomasks used in manufacturing the display panel by using two gray-scale mask processes. In addition, the display panel accordingly to the embodiment of the present invention reduces the number of photomasks used in manufacturing the display panel by using the gate as a light shielding layer, omitting a flat layer, and using a bottom electrode (bottom ITO; BITO) layer as a pixel electrode, thereby reducing manufacturing costs.

DETAILED DESCRIPTION OF THE PREFERRED EMBODIMENTS

The following description of the embodiments is provided by reference to the following drawings and illustrates the specific embodiments of the present invention. Directional terms mentioned in the present invention, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

First of all, the method of manufacturing the display panel in the prior art, for example, needs to sequentially fabricate the following components through nine photomask steps, including a light shielding layer (LS layer), and fabricating a polysilicon layer (Poly crystal silicon layer; poly layer), fabricating a gate layer (GE layer) and carrier doping ($N^+$&$N^-$), fabricating an interlayer dielectric layer (ILD layer), fabricating a source/drain contact layer (SD layer), fabricating a planar layer (PLN layer), fabricating a bottom electrode layer (bottom ITO; BITO) as a common electrode, fabricating a passivation layer (PV layer) and an top electrode layer (top ITO; TITO) as a pixel electrode. Compared with the above manufacturing method of the display panel, the manufacturing method of the display panel according to the embodiment of the invention can reduce the number of photomasks used in the manufacturing processes, thereby reducing the manufacturing costs.

Referring to FIG. 1 and FIG. 2A to FIG. 2K, a method of manufacturing the display panel according to one embodiment of the present invention mainly includes steps 11 to 18, providing a substrate (step 11), forming a gate on the substrate (step 12), forming a gate insulating layer on the gate and the substrate (step 13), forming a polysilicon on the gate insulating layer (step 14), performing a first gray-scale mask process on the polysilicon layer to form a source region, a drain region and an active region located between the source region and the drain region by the polysilicon layer (step 15), forming an interlayer dielectric layer on the gate insulating layer and the polysilicon layer (step 16), forming a first electrode layer on the interlayer dielectric layer (step 17), and performing a second gray-scale mask process on the first electrode layer and the interlayer dielectric layer, wherein the second gray-scale mask process includes patterning the first electrode layer to form a first electrode pattern layer and forming a source via and a drain via in the interlayer dielectric layer, and the source via exposes the source region and the drain via exposes the drain region (step 18). The detailed description of constructional details, assembly relationship and operation principle of the above-described respective components of the embodiment the invention will be described in detail below.

Figure 1:
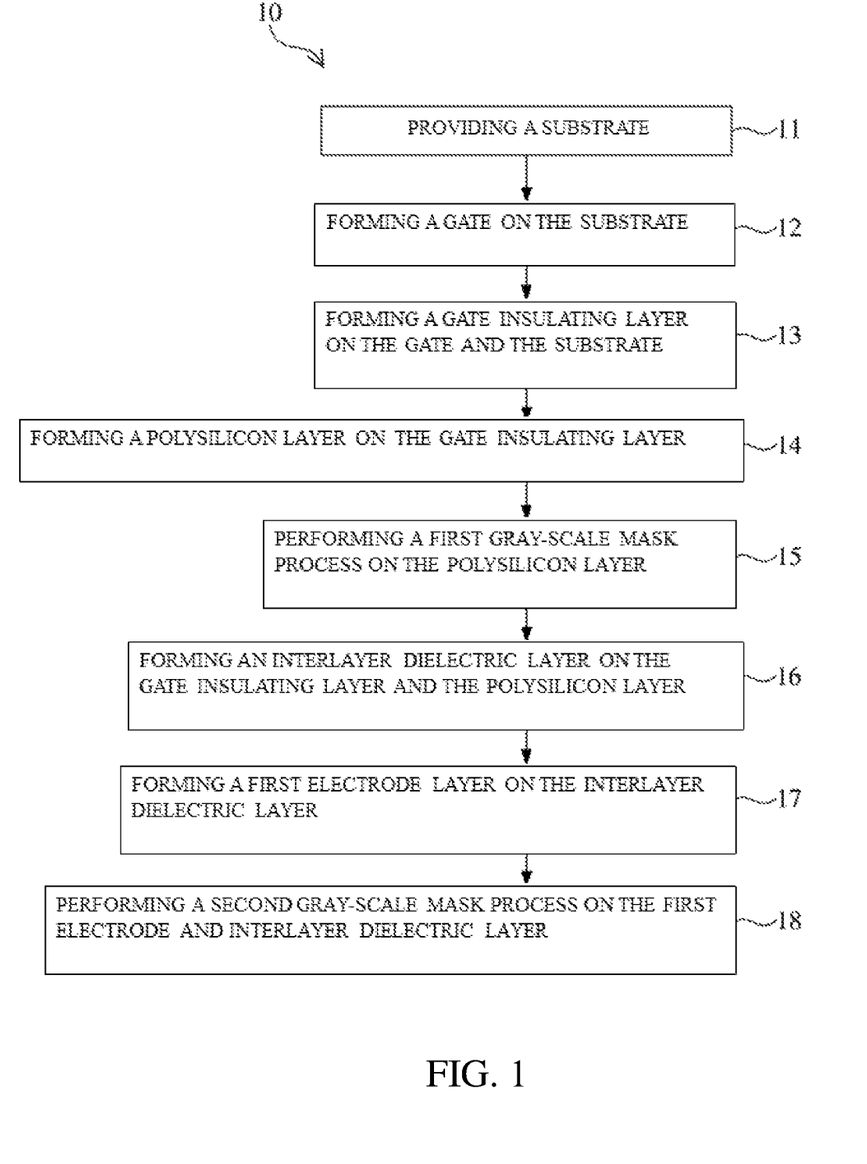
FIG. 1 is a schematic flow chart showing a method of manufacturing a display panel according to one embodiment of the present invention.
Figure 2A:
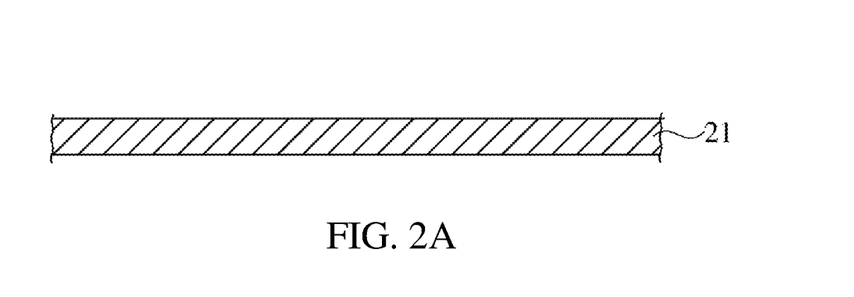
FIG. 2A to FIG. 2K are schematic cross-sectional views of process steps of a method of manufacturing a display panel according to one embodiment of the present invention.

Referring to FIG. 1 and FIG. 2A, a first step 11 of a method 10 of manufacturing a display panel according to one embodiment of the present invention is to provide a substrate 21. In this step 11, the substrate 21 is, for example, a substrate used for carrying the gate, the gate insulating layer, the polysilicon layer, the interlayer dielectric layer, and the first electrode pattern layer. In one embodiment, the substrate 21 is, for example, a flexible substrate, a transparent substrate, or a flexible transparent substrate.

Figure 2B:
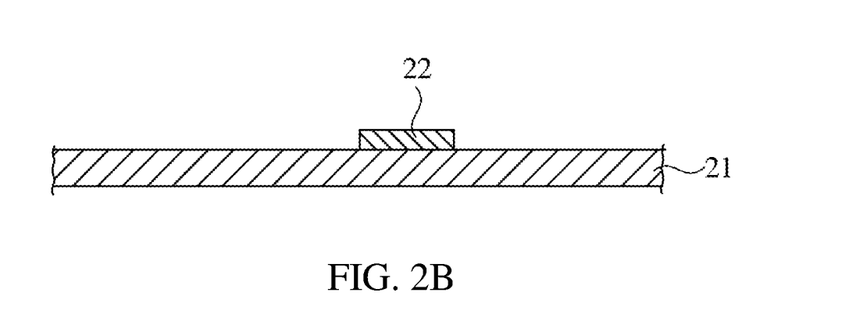

Referring to FIG. 1 and FIG. 2B, a next step 12 of the method 10 of manufacturing a display panel according to one embodiment of the present invention is to form a gate 22 on the substrate 21. In this step 12, the gate 22 is formed on the substrate through, for example, lithography etching processes. That is, a photomask process is required in this step 12. It is to be noted that the gate 22 can also be served as a light shielding layer for shielding the active region of the polysilicon layer which is formed subsequently. In one embodiment, step 12 is to make the gate layer 22 functioning as a shielding layer and a gate electrode through fabricating a bottom gate, thereby reducing the number of the used photomasks.

Figure 2C:
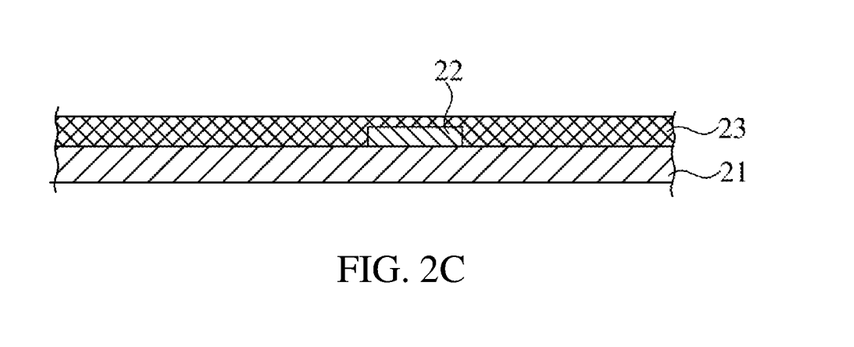

Referring to FIG. 1 and FIG. 2C, a next step 13 of the method 10 of manufacturing a display panel according to one embodiment of the present invention is to form a gate insulating 23 on the gate 22 and the substrate 21. In this step 13, the gate insulating layer 23 is deposited on the gate 22 and the substrate 21 through using, for example, general materials or common manufacturing methods which are known in semiconductor manufacturing.

Figure 2D:
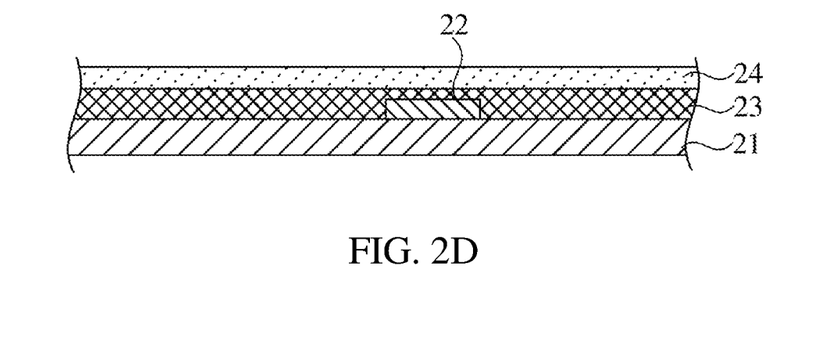

Referring to FIG. 1 and FIG. 2D, a next step 14 of the method 10 of manufacturing a display panel according to one embodiment of the present invention is to form a polysilicon 24 on the gate insulating layer 23. In this step 14, the polysilicon layer 24 is formed through, for example, forming an amorphous silicon layer (not shown) on the gate insulating layer 23 and then performing a laser annealing process on the amorphous silicon layer, and thus amorphous silicon layer is formed to the polysilicon layer 24.

Figure 2E:
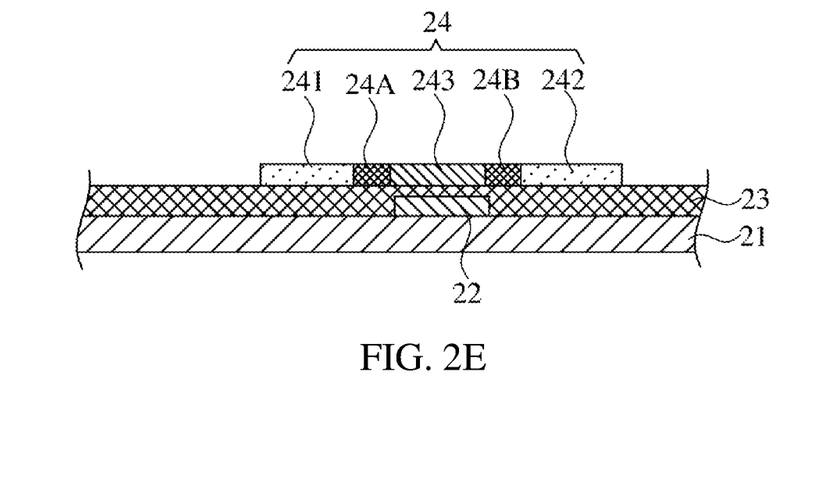

Referring to FIG. 1 and FIG. 2E, a next step 15 of the method 10 of manufacturing a display panel according to one embodiment of the present invention is to perform a first gray-scale mask process on the polysilicon layer 24 and thus a source region 241, a drain region 242 and an active region 241 located between the source region 241 and the drain region 242 by the polysilicon layer 24 are formed. In this step 15, the first gray-scale mask process, for example, is selected from the group consisting of a half tone photomask process and a gray tone photomask process. In one embodiment, the first gray-scale mask is, for example, used for performing a lithography etching process on the polysilicon layer 24, and thus photoresist layers with different thicknesses are formed on the polysilicon layer 24. Therefore, the source region 241 and the drain region 242 may be exposed by using different etching parameters, thereby performing carrier doping on the source region 241 and the drain region 242.

Figure 3A:
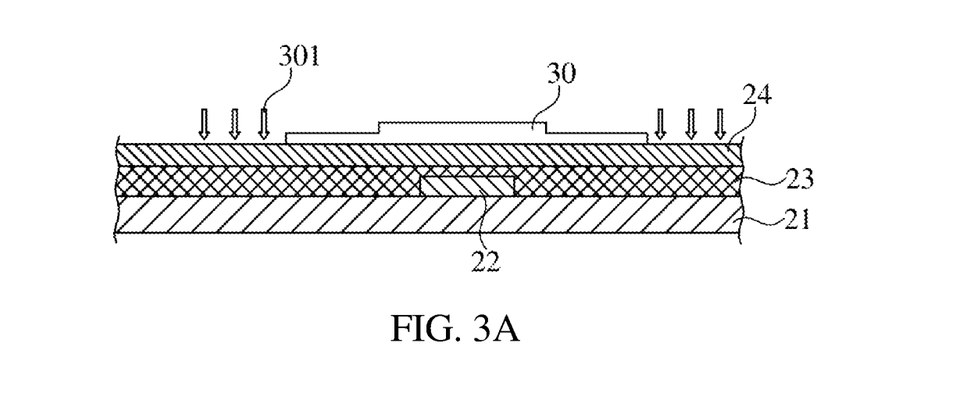
FIG. 3A to FIG. 3G are schematic cross-sectional views of a first gray-scale mask process steps of a method of manufacturing a display panel according to one embodiment of the present invention.
Figure 3B:
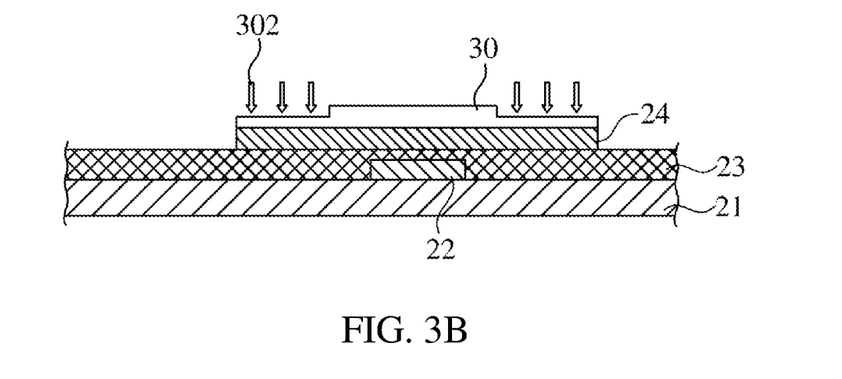
Figure 3C:
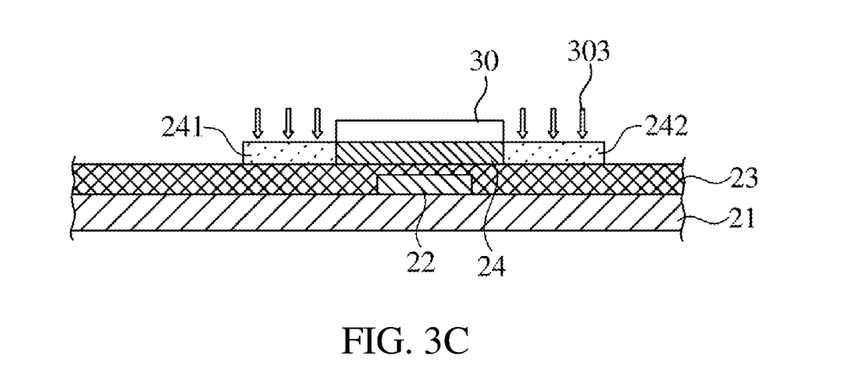
Figure 3D:
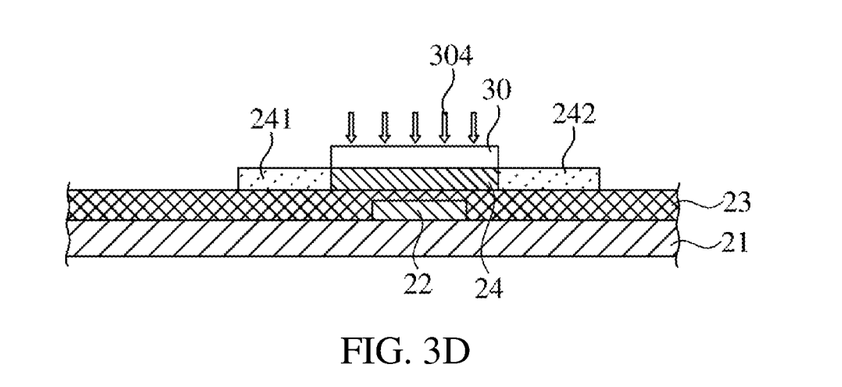
Figure 3E:
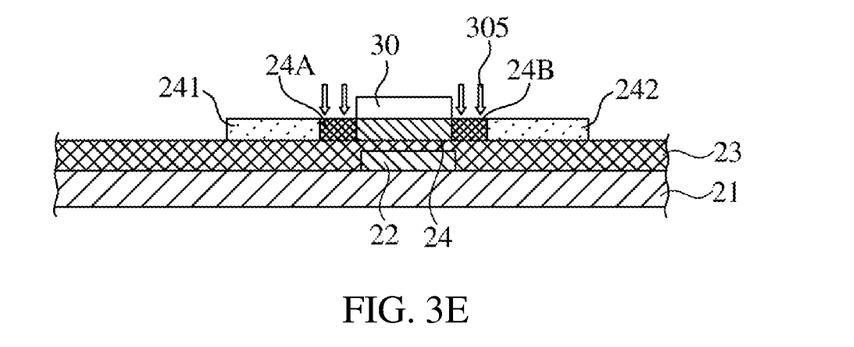
Figure 3F:
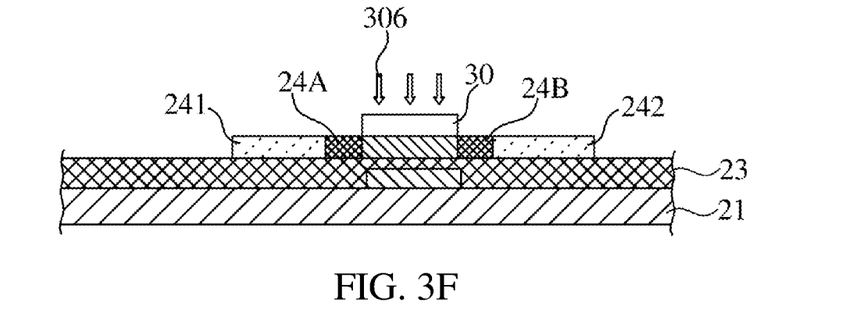
Figure 3G:
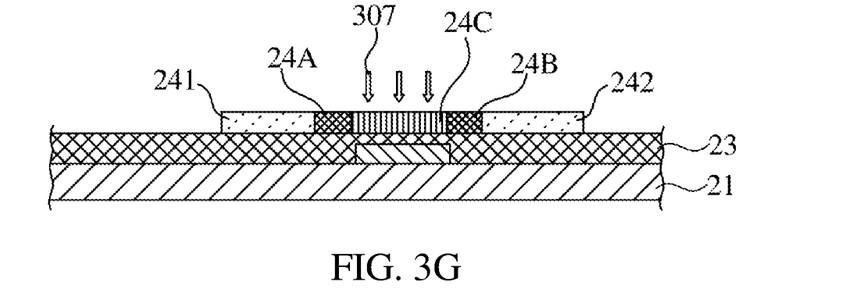

Referring to FIG. 3A to FIG. 3G, for example, FIG. 3A is a schematic illustration of performing a lithography etching process on the polysilicon layer 24 to form a photoresist layer 30 with different thicknesses on the polysilicon layer 24 by the first gray-scale mask process. As shown in FIG. 3A, the exposed portion of the polysilicon layer 24 can be patterned by an etching step 301. FIG. 3B is a schematic illustration of the first stripping photoresist step 302, exposing the predetermined source region 241 and drain region 242 with different etching parameters so as to facilitate heavy carrier doping 303 (as shown in FIG. 3C). FIG. 3D is a schematic illustration of a second stripping photoresist step 304. Other portions 24A and 24B of the polysilicon layer 24 may be also exposed with different etching parameters so as to facilitate light carrier doping 305 (as shown in FIG. 3E), and thus the effect of the thin film transistor is improved. FIG. 3F is a schematic illustration of a third stripping photoresist step 306, all of the photoresists are stripped with different etching parameters, and the remaining portion 24C of the polysilicon layer (i.e., active region 243, which is served as an electron hole transfer channel) is exposed, and thus carrier doping 307 is performed on the remaining portion 24C (as shown in FIG. 3G).

Figure 2F:
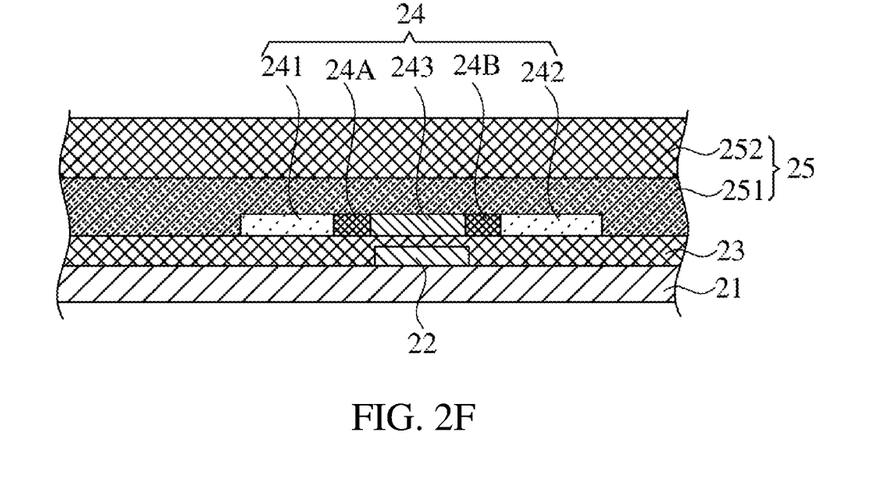

Referring to FIG. 1 and FIG. 2F, a next step 16 of the method 10 of manufacturing a display panel according to one embodiment of the present invention is to form an interlayer dielectric layer 25 on the gate insulating 23 and the polysilicon layer 24. In this step 16, for example, the interlayer dielectric layer 25 is deposited on the gate insulating layer 23 and the polysilicon layer 24 through using, for example, general materials or common manufacturing methods known in semiconductor manufacturing. In one embodiment, for example, the interlayer dielectric layer 25 includes a multilayer material consisting of a silicon nitride layer 251 and a silicon oxide layer 252.

Figure 2G:
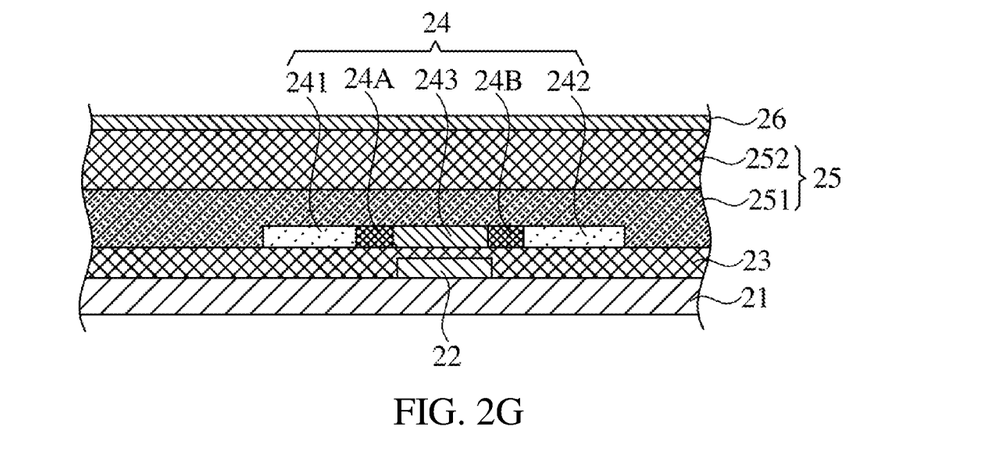

Referring to FIG. 1 to FIG. 2G, a next step 17 of the method 10 of manufacturing a display panel according to one embodiment of the present invention is to form a first electrode layer on the interlayer dielectric layer 25. In this step 17, material of the first electrode layer 26 is such as indium tin oxide (ITO), and the first electrode 26 can serve as a bottom layer (bottom ITO; BITO).

Figure 2H:
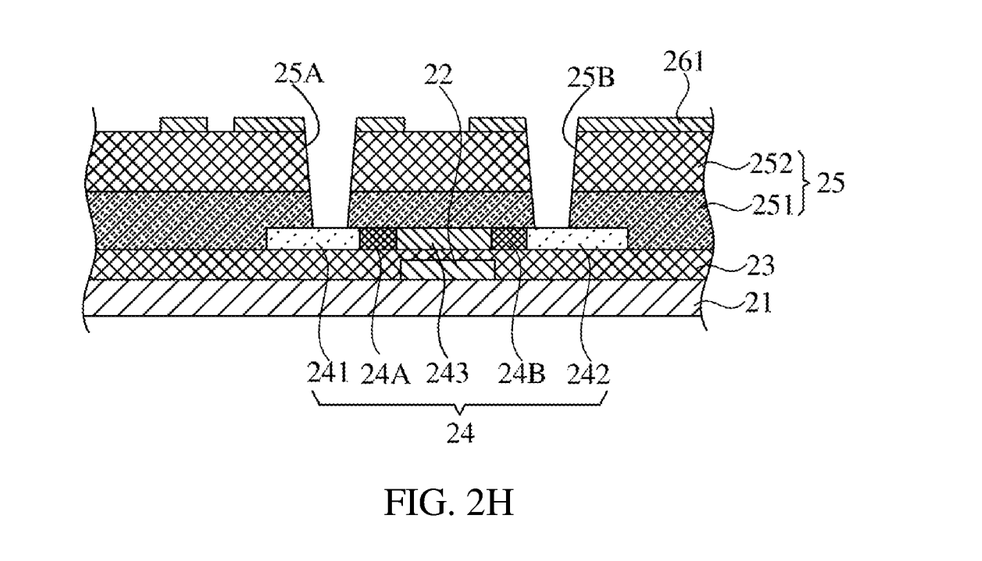

Referring to FIG. 1 and FIG. 2H, a final step 18 of the method 10 of manufacturing a display panel according to one embodiment of the present invention is to perform a second gray-scale mask process on the first electrode layer 26 and the interlayer dielectric layer 25. The second gray-scale mask process includes patterning the first electrode layer 26 to form a first electrode pattern layer 261 and a source via 25A and a drain via 25B in the interlayer dielectric layer 25. The source via 25A exposes the source region 241 and the drain via 25B exposes the drain region 242 (step 18). In this step 18, the second gray-scale mask process is selected from the group consisting of a half tone photomask process and a gray tone photomask process. In one embodiment, the second gray-scale mask process, for example, performs a lithography etching process on the first electrode layer 26 and the interlayer dielectric layer 25, and then photoresist layers with different thicknesses are formed on the first electrode layer 26 and the interlayer dielectric layer 25.

Figure 4A:
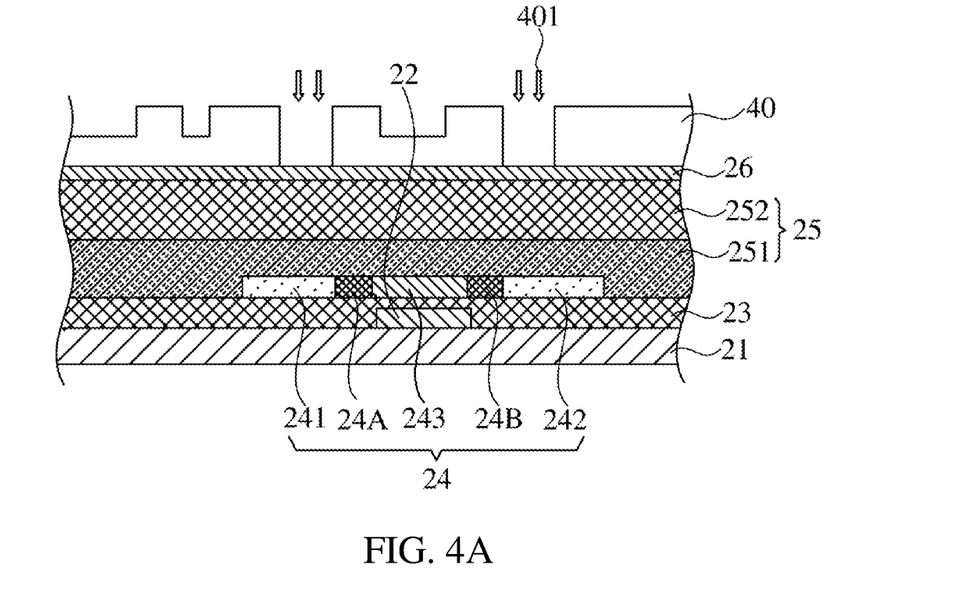
FIG. 4A to FIG. 4D are schematic cross-sectional views of a second gray-scale mask process steps of a method of manufacturing a display panel according to one embodiment of the present invention.
Figure 4B:
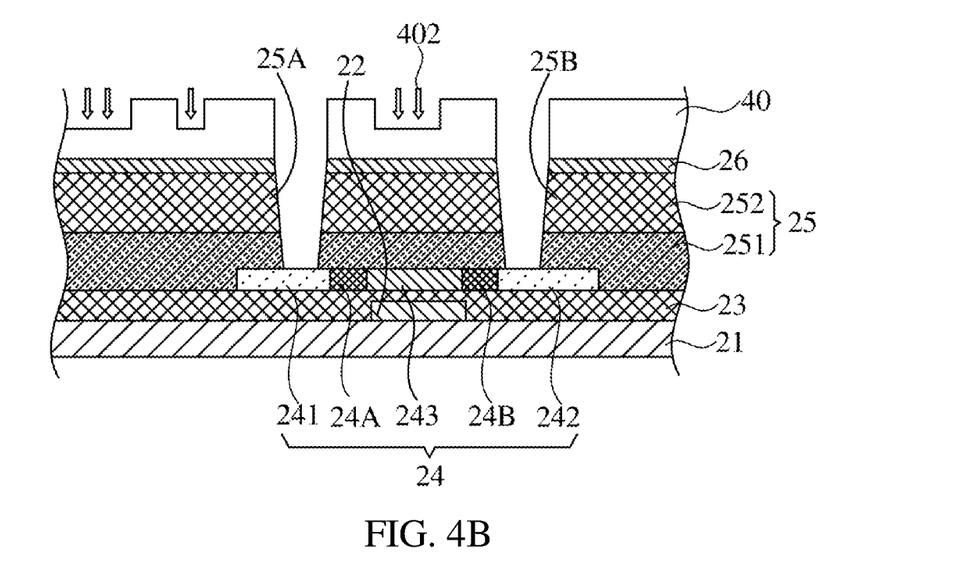
Figure 4C:
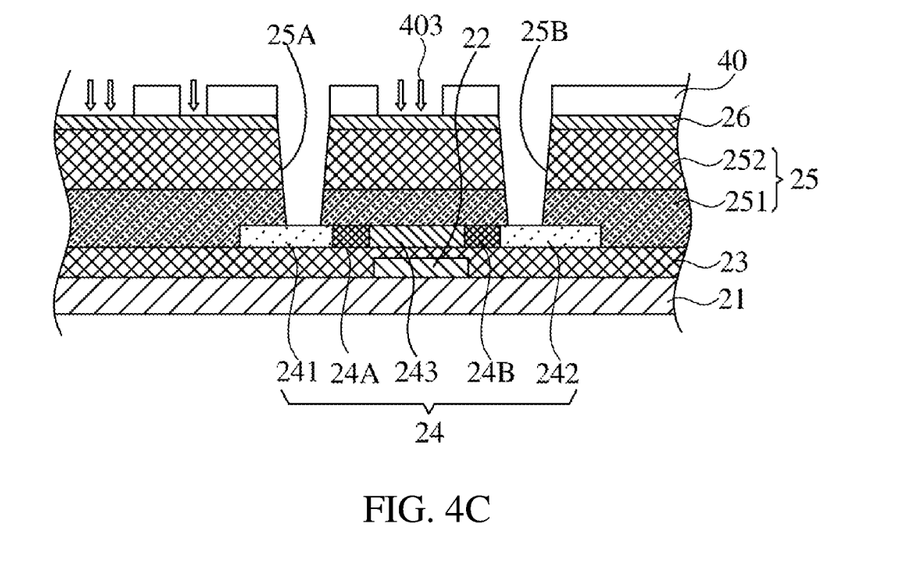
Figure 4D:
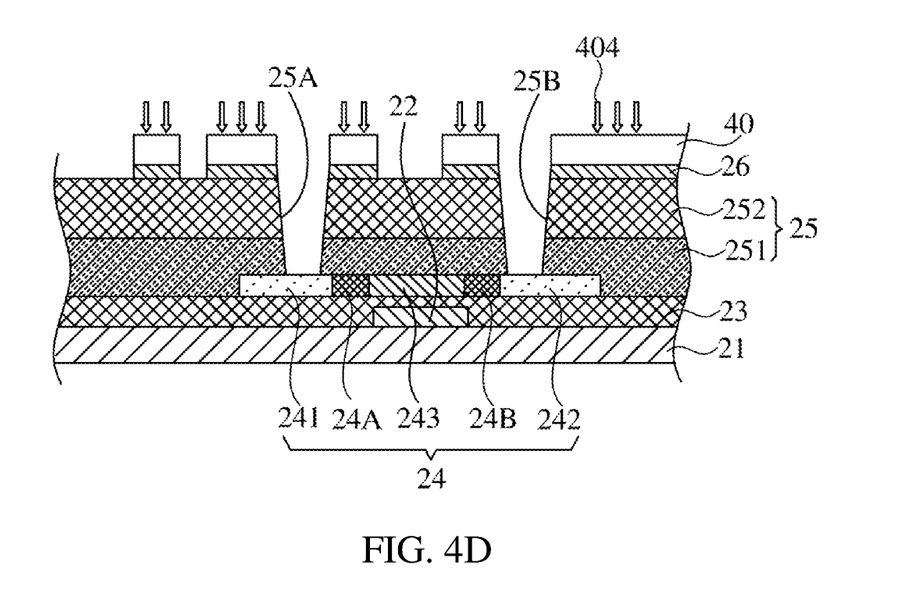

Referring to FIG. 4A to FIG. 4D, for example, FIG. 4A is a schematic illustration of performing a lithography etching process on the first electrode layer and the interlayer dielectric layer to form photoresist layers with different thicknesses on the first electrode layer 26 and the interlayer dielectric layer 25 through the second gray-scale mask process. As shown in FIG. 4A, an exposed portion of the first electrode 26 can be formed to the source via 25A and the drain via 25B by an etching process 401. FIG. 4B is a schematic illustration of step 402 for stripping the photoresist layer 40 for first time. Patterning the first electrode layer 26 to form the first electrode pattern layer 261 by step 403 with different etching parameters (as shown in FIG. 4C), and the first electrode pattern layer 261 can be a pixel electrode. FIG. 4D is a schematic illustration of step 404 for stripping the photoresist layer 40 for the second time, and all of the photoresist layers 40 are stripped with different etching parameters.

As can be seen from the above, the first electrode pattern layer 261 can be formed and the source via 25A and the drain via 25B are formed in the interlayer dielectric layer 25 by using a photomask process (the second gray-scale mask process), and thus the number of used photomasks can be reduced.

Figure 2I:
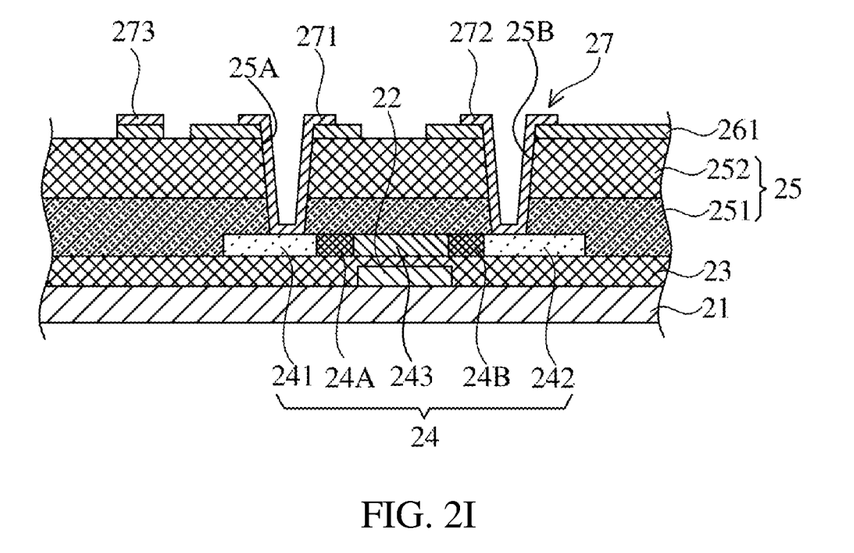

Referring to FIG. 2I, in one embodiment of the present invention, it further includes steps of forming an electronic material pattern layer 27 on the first electrode pattern layer 261 and in the source via 25 and drain via 25B of the interlayer dielectric layer 25, and the electronic material pattern layer 27 includes a source contact layer 271 and a drain contact layer 272, and the source contact layer 271 is electronically connected to the source region 241 through the source via 25A, and the drain contact layer 272 electronically connected to the drain region 242 through the drain via 25B. In another embodiment, the electronic material pattern layer 27 is formed on the first electrode pattern layer 261 and in the source via 25 and drain via 25B of the interlayer dielectric layer 25 by lithography etching processes. That is, the electronic material pattern layer 27 is formed by a photomask process.

Figure 2J:
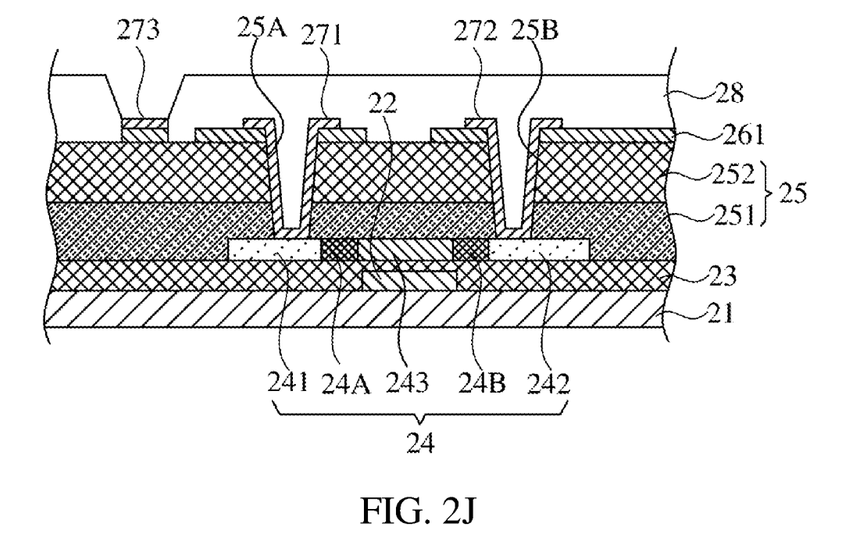

Referring to 2J, in one embodiment of the present invention, the electronic material pattern 27 further includes an electrode contact layer 273, and the method 10 of manufacturing a display panel according to the embodiment of the present invention further includes steps of forming a passivation pattern layer 28 on the source contact layer 271 and the drain contact layer 272, and the passivation pattern layer 28 exposes the electrode contact layer 273. In one embodiment, the passivation pattern layer 28 is, for example, formed on the source contact layer 271 and the drain contact layer 272 by lithography processes. That is, the passivation pattern layer 28 is formed by a photomask process.

Figure 2K:
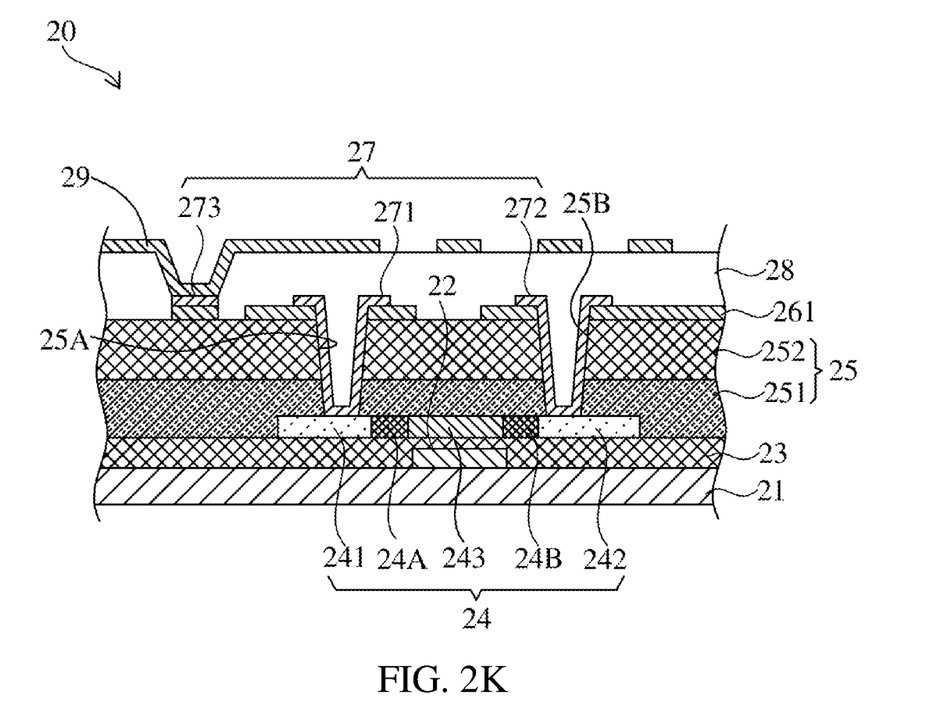

Referring to FIG. 2K, in one embodiment of the present invention, the method 10 of manufacturing a display panel according to the embodiment of the present invention further includes forming a second electrode pattern layer 29 on the passivation pattern layer 28 and the electrode contact layer 273. A material of the second electrode pattern layer 29 is, for example, Indium Tin Oxide (ITO), and the second electrode pattern layer 29 can be served as a top electrode layer (Top ITO; TITO). In one embodiment, the second electrode pattern layer 29 is, for example, formed on the passivation pattern layer 28 and the electrode contact layer 273 by lithography etching processes, and the second electrode pattern layer 29 can be served as a common electrode. That is, the second electrode pattern layer 29 is formed by using a photomask process.

In one embodiment of the present invention, the method 10 of manufacturing a display panel according to the embodiment of the present invention can reduce the number of used photomasks by a second gray-scale mask process during manufacturing the display panel. In addition, the method of manufacturing a display panel according to the embodiment of the present invention can make a gate layer functioning as a light shielding layer and a gate electrode by fabricating a bottom gate electrode, whereby the number of used photomasks is reduced. Moreover, the method of manufacturing a display panel according to the embodiment of the present invention further can reduce the used photomasks without fabricating a planar layer. Therefore, the display panel of the embodiment of the present invention can fabricate the upper electrode layer through a six-photomasks process as compared to the display panel manufacturing method of the prior art which needs a nine-photomasks process.

Referring to FIG. 2K, one embodiment of the present invention further provides a display panel 20 including a substrate 21, a gate 22, a gate insulating layer 23, a polysilicon layer 24, an interlayer dielectric layer 25 and a first electrode pattern layer 261. The gate 22 is disposed on the substrate 21. The gate insulating layer 23 is disposed on the gate 22 and the substrate 21. The polysilicon layer 24 is disposed on the gate insulating layer 23, and the polysilicon layer includes a source region 241, a drain region 242 and an active region 243 disposed between the source region 241 and the drain region 242. The interlayer dielectric layer 25 includes a source via 25A and a drain via 25B, and the source via 25A exposes the source region 241 and drain via 25B exposes the drain region 242. The first electrode pattern layer 26 is disposed on the interlayer dielectric layer 25.

In one embodiment of the present invention, the display panel further includes an electronic material pattern layer 27 disposed on the first electrode pattern layer 26 and in the source via 25A and drain via 25B of the interlayer dielectric layer 25. The electronic material pattern layer 27 includes a source contact layer 271 and a drain contact layer 272. The source contact 271 is electronically connected to the source region 241 through the source via 25A. The drain contact layer 272 is electronically connected to the drain region 242 through the drain via 25B.

In one embodiment of the present invention, the electronic material pattern layer 27 further includes an electrode contact layer 273, and the display panel includes a passivation pattern layer 28. The passivation pattern layer 28 is disposed on the source contact layer 271 and drain contact layer 272, and the passivation pattern layer 28 exposes the electrode contact layer 273.

In one embodiment of the present invention, the display panel further includes a second pattern layer 29 disposed on the passivation pattern layer 28 and the electrode contact layer 273.

In one embodiment of the present invention, the polysilicon layer 24 is formed by a first gray-scale mask process, and the first electrode pattern layer 26 and the interlayer dielectric layer 25 are formed by a second gray-scale mask process.

In one embodiment of the present invention, the display panel 20 can be obtained by the method 10 of manufacturing a display panel according to the embodiment of the present invention. Therefore, the related embodiments and examples are not repeatedly described.

The present invention has been described by the above embodiments, but the embodiments are merely examples for implementing the present invention. It must be noted that the embodiments do not limit the scope of the invention. In contrast, modifications and equivalent arrangements are intended to be included within the scope of the invention.

What is claimed is:

1. A method of manufacturing a display panel, comprising:

providing a substrate;
forming a gate on the substrate;
forming a gate insulating layer on the gate and the substrate;
forming a polysilicon layer on the gate insulating layer;
performing a first gray-scale mask process on the polysilicon layer to form a source region, a drain region and an active region located between the source region and the drain region by the polysilicon layer, wherein the first gray-scale mask process is selected from the group consisting of a half tone photomask process and a gray tone photomask process;
forming an interlayer dielectric layer on the gate insulating layer and the polysilicon layer; forming a first electrode layer on the interlayer dielectric layer;
performing a second gray-scale mask process on the first electrode layer and the interlayer dielectric layer, wherein the second gray-scale mask process is selected from the group consisting of the half tone photomask process and the gray tone photomask process, and the second gray-scale mask process comprises:
patterning the first electrode layer to form a first electrode pattern layer; and
forming a source via and a drain via in the interlayer dielectric layer, wherein the source via exposes the source region and the drain via exposes the drain region; and
forming an electronic material pattern layer on the first electrode pattern layer and in the source via and the drain via of the interlayer dielectric layer, wherein the electronic material pattern layer comprises a source contact layer and a drain contact layer, the source contact layer is electrically connected to the source region through the source via, and the drain contact layer is electrically connected to the drain region through the drain via.

2. The method of manufacturing a display panel according to claim 1, wherein the electronic material pattern layer further comprises an electrode contact layer, and the method of manufacturing the display panel further comprises: forming a passivation pattern layer on the source contact layer and the drain contact layer, wherein the passivation pattern layer exposes the electrode contact layer.

3. The method of manufacturing a display panel according to claim 2, further comprising forming a second electrode pattern layer on the passivation pattern layer and the electrode contact layer.

4. A method of manufacturing a display panel, comprising:
providing a substrate;
forming a gate on the substrate;
forming a gate insulating layer on the gate and the substrate;
forming a polysilicon layer on the gate insulating layer;
performing a first gray-scale mask process on the polysilicon layer to form a source region, a drain region and an active region located between the source region and the drain region by the polysilicon layer;
forming an interlayer dielectric layer on the gate insulating layer and the polysilicon layer; forming a first electrode layer on the interlayer dielectric layer;
performing a second gray-scale mask process on the first electrode layer and the interlayer dielectric layer, wherein the second gray-scale mask process comprises:
patterning the first electrode layer to form a first electrode pattern layer; and
forming a source via and a drain via in the interlayer dielectric layer, wherein the source via exposes the source region and the drain via exposes the drain region.

5. The method of manufacturing a display panel according to claim 4, wherein the first gray-scale mask process and the second gray-scale mask process are selected from the group consisting of a half tone photomask process and a gray tone photomask process.

6. The method of manufacturing a display panel according to claim 4, further comprising: forming an electronic material pattern layer on the first electrode pattern layer and in the source via and the drain via of the interlayer dielectric layer, wherein the electronic material pattern layer comprises a source contact layer and a drain contact layer, the source contact layer is electrically connected to the source region through the source via, and the drain contact layer is electrically connected to the drain region through the drain via.

7. The method of manufacturing a display panel according to claim 6, wherein the electronic material pattern layer further comprises an electrode contact layer, and the method of manufacturing the display panel further comprises: forming a passivation pattern layer on the source contact layer and the drain contact layer, wherein the passivation pattern layer exposes the electrode contact layer.

8. The method of manufacturing a display panel according to claim 7, further comprising forming a second electrode pattern layer on the passivation pattern layer and the electrode contact layer.

9. A display panel, comprising:
a substrate;
a gate, wherein the gate is disposed on the substrate;
a gate insulating layer, wherein the gate insulating layer is disposed on the gate and the substrate;
a polysilicon layer, wherein the polysilicon layer is disposed on the gate insulating layer, and the polysilicon layer comprises a source region, a drain region and an active region located between the source region and the drain region;
an interlayer dielectric layer, wherein the interlayer dielectric layer is disposed on the gate insulating layer and the polysilicon layer, the interlayer dielectric layer comprises a source via and a drain via, and the source via exposes the source region and the drain via exposes the drain region; and
a first electrode pattern layer, wherein the first electrode pattern layer is disposed on the interlayer dielectric layer; and
an electronic material pattern layer disposed on the first electrode pattern layer and in source via and drain via of the interlayer dielectric layer, wherein the first electrode pattern layer is a pixel electrode.

10. The display panel of claim 9, wherein the electronic material pattern layer comprises:
a source contact layer, wherein the source contact layer is electrically connected to the source region through source via; and
a drain contact layer, wherein the drain contact layer is electrically connected to the drain region through drain via.

11. The display panel of claim 10, wherein the electronic material pattern layer further comprises an electrode contact layer, and the display panel comprises a passivation pattern layer, and the passivation pattern layer is disposed on the source contact layer and the drain contact layer, wherein the passivation pattern layer exposes the electrode contact layer.

12. The display panel of claim 11, further comprising a second electrode pattern layer disposed on the passivation pattern layer and the electrode contact layer.

\* \* \* \* \*